(12) United States Patent
Calderoni et al.

(10) Patent No.: US 9,099,174 B2
(45) Date of Patent: Aug. 4, 2015

(54) DRIFT ACCELERATION IN RESISTANCE VARIABLE MEMORY

(71) Applicant: Micron Technology, Inc., Boise, ID (US)

(72) Inventors: Alessandro Calderoni, Milan (IT); Massimo Ferro, Camisano (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 476 days.

(21) Appl. No.: 13/647,527

(22) Filed: Oct. 9, 2012

(65) Prior Publication Data

US 2014/0098593 A1 Apr. 10, 2014

(51) Int. Cl.
*G11C 11/00* (2006.01)

(52) U.S. Cl.
CPC ...................................... *G11C 11/00* (2013.01)

(58) Field of Classification Search
CPC ........... G11C 13/0069; G11C 13/0064; G11C 11/5678; G11C 11/16; G11C 13/0004; G11C 13/004; G11C 13/0007; G11C 13/0021; G11C 11/00; G11C 16/10; G11C 16/3436
See application file for complete search history.

(56) References Cited

U.S. PATENT DOCUMENTS

| | | | |
|---|---|---|---|
| 7,289,351 B1 * | 10/2007 | Chen et al. ..................... | 365/148 |
| 7,701,749 B2 | 4/2010 | Jeong et al. | |
| 7,940,553 B2 * | 5/2011 | Wu et al. ........................ | 365/163 |
| 8,144,508 B2 | 3/2012 | Franceschini et al. | |
| 8,611,135 B2 * | 12/2013 | Wang et al. ..................... | 365/148 |
| 8,929,124 B2 * | 1/2015 | Kim et al. ....................... | 365/148 |
| 8,958,233 B2 * | 2/2015 | Chen .............................. | 365/148 |
| 2004/0264234 A1 * | 12/2004 | Moore et al. ................... | 365/148 |
| 2005/0231999 A1 | 10/2005 | Moriyama | |
| 2007/0047296 A1 * | 3/2007 | Philipp et al. .................. | 365/163 |
| 2008/0043521 A1 * | 2/2008 | Liaw et al. ..................... | 365/163 |
| 2008/0175035 A1 | 7/2008 | Taguchi | |
| 2009/0052236 A1 | 2/2009 | Bae et al. | |
| 2010/0188885 A1 | 7/2010 | Toda et al. | |
| 2011/0194328 A1 * | 8/2011 | Kim et al. ....................... | 365/148 |
| 2012/0014164 A1 | 1/2012 | Kamoshida et al. | |
| 2012/0092923 A1 | 4/2012 | Bedeschi et al. | |
| 2012/0147667 A1 | 6/2012 | Chen | |

FOREIGN PATENT DOCUMENTS

WO 2011080770 A1 7/2011

OTHER PUBLICATIONS

International Search Report and Written Opinion of international application No. PCT/US2013/063194, dated Jan. 22, 2014, 9 pp.
Boniardi, et al., "Physical Origin of the Resistance Drift Exponent in Amorphous Phase Change Materials," Jun. 16, 2011, 3 pages, Milano, Italy.
Related U.S. Appl. No. 13/275,901, entitled, "Stabilization of Resistive Memory," filed Oct. 18, 2011, 28 pages.

* cited by examiner

*Primary Examiner* — Hien Nguyen
(74) *Attorney, Agent, or Firm* — Brooks, Cameron & Huebsch, PLLC

(57) ABSTRACT

The present disclosure includes apparatuses and methods including drift acceleration in resistance variable memory. A number of embodiments include applying a programming signal to the resistance variable memory cell to program the cell to a target state, subsequently applying a pre-read signal to the resistance variable memory cell to accelerate a drift of a resistance of the programmed cell, and subsequently applying a read signal to the resistance variable memory cell.

27 Claims, 5 Drawing Sheets

DRIFT ACCELERATION IN RESISTANCE VARIABLE MEMORY

TECHNICAL FIELD

The present disclosure relates generally to semiconductor memory apparatuses and methods, and more particularly, to drift acceleration in resistance variable memory.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistance variable memory, among others. Types of resistance variable memory include programmable conductor memory, phase change random access memory (PCRAM), resistive random access memory (RRAM), magnetoresistive random access memory (MRAM; also referred to as magnetic random access memory), and conductive-bridging random access memory (CBRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in non-volatile memory devices.

Resistance variable memory such as PCRAM includes resistance variable memory cells that can store data based on the resistance of a storage element, e.g., a storage element having a variable resistance. As such, resistance variable memory cells can be programmed to store data corresponding to a target state by varying the resistance level of the resistance variable storage element. Resistance variable memory cells can be programmed to a target state, e.g., corresponding to a particular resistance, by applying sources of an electrical field or energy, such as positive or negative electrical signals, e.g., positive or negative voltage or current signals, to the cells, e.g., to the storage element of the cells, for a particular time interval.

One of a number of states, e.g., resistance states, can be set for a resistance variable memory cell. For example, a single level cell (SLC) may be programmed to one of two states, e.g., logic 1 or 0, which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multilevel cells (MLCs).

The state of a resistance variable memory cell can be determined, e.g., read, by sensing current through the cell responsive to an applied interrogation voltage. The sensed current, which varies based on the resistance of the cell, can indicate the state of the cell, e.g., the binary data stored by the cell. However, the resistance of a programmed resistance variable memory cell can drift, e.g., shift, over time. Resistance drift can result in erroneous sensing of a resistance variable memory cell, e.g., a determination that the cell is in a state other than that to which it was programmed, among other issues.

DETAILED DESCRIPTION

Figure 1:
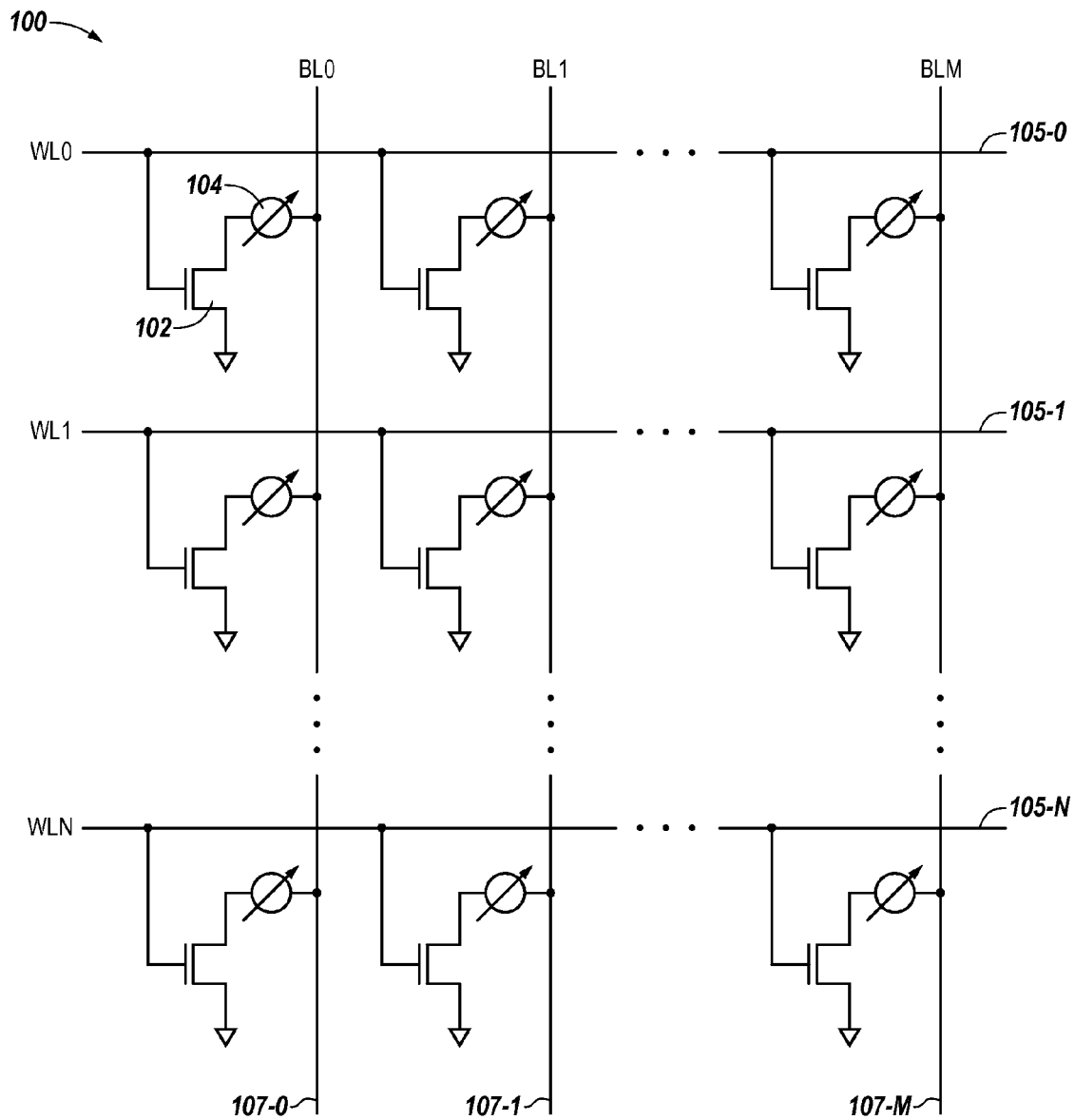
FIG. 1 is a schematic of a portion of an array of resistance variable memory cells that can be operated in accordance with a number of embodiments of the present disclosure.

The present disclosure includes apparatuses and methods associated drift acceleration in resistance variable memory. A number of embodiments include applying a programming signal to the resistance variable memory cell to program the cell to a target state, subsequently applying a pre-read signal to the resistance variable memory cell to accelerate a drift of a resistance of the programmed cell, and subsequently applying a read signal to the resistance variable memory cell.

A number of embodiments of the present disclosure can accelerate resistance drift associated with the programmed states of resistance variable memory cells, e.g., phase change memory cells, which can provide improved stabilization of resistance states as compared to previous approaches. For example, a number of embodiments of the present disclosure can accelerate resistance drift via application of a pre-read signal, e.g., a voltage signal, to the programmed cell before readout. The pre-read signal can be a more viable way to accelerate drift as compared to prior approaches such as drift acceleration through temperature, e.g., via an anneal process. As such, embodiments of the present disclosure can provide benefits such as increased accuracy and/or reliability, e.g., decreased error rate, and/or increased memory life, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a schematic of a portion of an array 100 of resistance variable memory cells that can be operated in accordance with a number of embodiments of the present disclosure. In the embodiment illustrated in FIG. 1, the memory array 100 includes a number of memory cells, e.g., phase change memory cells, each having an associated access device 102 and resistance variable element 104, e.g., a phase change material 104. The access devices 102 can be operated, e.g., turned on/off, to select the memory cells in order to perform operations such as data programming and/or data reading operations on the resistance variable elements 104.

In the embodiment illustrated in FIG. 1, the access devices 102 are metal oxide semiconductor field effect transistors (MOSFETs). As shown in FIG. 1, a gate of each MOSFET 102 associated with each memory cell is coupled to one of a number of access lines 105-0 (WL0), 105-1 (WL1), . . . , 105-N (WLN), i.e., each access line 105-0, 105-1, . . . , 105-N is coupled to a row of memory cells, e.g., phase change memory cells. The access lines 105-0, 105-1, . . . , 105-N may be referred to herein as "word lines." The designator "N" is used to indicate that a memory array can include a number of access lines.

The resistance variable elements 104 can be, for example, a phase change chalcogenide alloy such as an indium(In)-antimony(Sb)-tellurium(Te) (IST) material, e.g., $In_2Sb_2Te_5$, $In_1Sb_2Te_4$, $In_1Sb_4Te_7$, etc., or a germanium-antimony-tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In the embodiment illustrated in FIG. 1, each resistance variable element 104 is coupled to one of a number of sense lines 107-0 (BL0), 107-1 (BL1), . . . , 107-M (BLM), i.e., each sense line 107-0, 107-1, . . . , 107-M is coupled to a column of memory cells, e.g., phase change memory cells. The sense lines 107-0, 107-1, . . . , 107-M may be referred to herein as "bit lines." The designator "M" is used to indicate that a memory array can include a number of sense lines. For ease of addressing in the digital environment, the number of access lines 105-1, . . . , 105-N and the number of sense lines 107-1, . . . , 107-M can each be some power of two, e.g., 256 access lines by 4,096 sense lines. However, embodiments are not limited to particular numbers of access lines and/or sense lines.

In operation, appropriate voltage and/or current signals, e.g., pulses, can be applied to the sense lines 107-0, 107-1, . . . , 107-M and access lines 105-0, 105-1, . . . , 105-N in order to program data to and/or read data from the memory cells of the array 100. As an example, the data stored by a memory cell of array 100 can be determined by turning on an access device 102 and sensing a current passing through the phase change element 104. The current sensed on the bit line associated with the memory cell being read, e.g., bit line 107-0, 107-1, . . . , 107-M, corresponds to a resistance level of the resistance variable element, e.g., phase change element, 104, which in turn corresponds to a particular data value, e.g., a binary value such as 1, 0, 001, 111, 1011, etc.

Embodiments of the present disclosure are not limited to the example array 100 illustrated in FIG. 1. For example, as one of ordinary skill in the art will appreciate, the access device 102 associated with a particular memory cell can be a device other than a MOSFET. In some embodiments, the access device 102 can be a two-terminal access device, e.g., a diode, a three-terminal access device, e.g., a bipolar junction transistor (BJT), among other types of access devices. Also, a memory array can have an architecture other than that illustrated in FIG. 1, as will be understood by one of ordinary skill in the art.

In operation, a phase change memory cell can be programmed to one of a number of states. For example, a single level cell (SLC) may be programmed to a reset state (amorphous state) or a set state (crystalline state). A reset pulse, e.g., a pulse used to program a cell to a reset state, can include a relatively high current pulse applied to the cell for a relatively short period of time such that the phase change material of the cell melts and rapidly cools, resulting in a relatively small amount of crystallization. Conversely, a set pulse, e.g., a pulse used to program a cell to a set state, can include a relatively lower current pulse applied to the cell for a relatively longer time interval and with a slower quenching speed, which results in an increased crystallization of the phase change material. As an example, the reset state may correspond to a stored binary data value of "0" and the set state may correspond to a stored binary data value of "1," for instance. In a number of embodiments, a phase change memory cell can be programmed to one of more than two states. For instance, a multilevel cell (MLC) can be programmed to one of a set state, a reset state, and a number of intermediate states, e.g., a number of states corresponding to a resistance levels between a resistance level corresponding to the set state and the resistance level corresponding to the reset state. As such, an MLC can store multiple binary digits. For instance, a phase change cell programmable to one of four states, e.g., a set state, a reset state, and two intermediate states, can store two binary digits, e.g., 11, 10, 01, and 00.

Figure 2A:
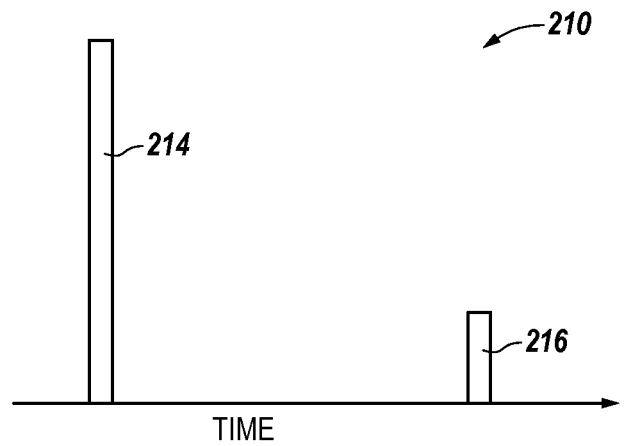
FIG. 2A is a graph illustrating signals associated with operating resistance variable memory cells in accordance with prior approaches.

FIG. 2A is a graph 210 illustrating signals associated with operating resistance variable memory cells in accordance with prior approaches. Graph 210 includes a programming signal, e.g., pulse, 214 and a read signal, e.g., pulse, 216. Programming signal 214 can be applied to a selected cell to program the cell to a target state. Read signal 216 can be applied to a selected cell to read the cell, to determine the state of the cell. The programming signal 214 and the read signal 216 can be current and/or voltage pulses, for instance.

A memory cell, e.g., a phase change memory cell, operated in accordance with graph 210 can experience resistance drift during the time between application of programming pulse 214 and read pulse 216. That is, the resistance of the programmed cell can shift over time. Such resistance drift can be due to a spontaneous increase of the resistance of the cell after programming, e.g., due to structural relaxation of an amorphous portion of the phase change element, for instance.

Figure 2B:
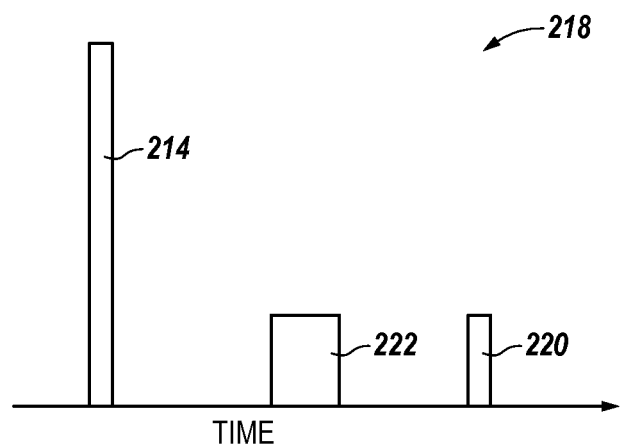
FIG. 2B is a graph illustrating signals associated with operating resistance variable memory cells in accordance with a number of embodiments of the present disclosure.

FIG. 2B is a graph 218 illustrating signals associated with operating resistance variable memory cells in accordance with a number of embodiments of the present disclosure. Graph 218 includes a programming signal, e.g., pulse, 214, a pre-read signal, e.g., pulse, 222, and a read signal, e.g., pulse 220. Programming signal 214 can be applied to a selected cell to program the cell to a selected state. Read signal 220 can be applied to a selected cell to read the cell, e.g., to determine the state of the cell.

Pre-read signal 222 can be applied to a selected cell to accelerate a drift of a resistance of a programmed selected cell in accordance with embodiments described herein. A particular pre-read signal 222 can be determined, for instance, based on a target state. The programming signal 214, the pre-read signal 222, and the read signal 216 can be current and/or voltage pulses, for instance. In a number of embodiments, an application of pre-read signal 222 can increase stability of a state of the memory cell, increase a rate of stabilization of a state of the memory cell, and increase accuracy, reliability, and/or memory cell life, among other benefits.

Figure 3:
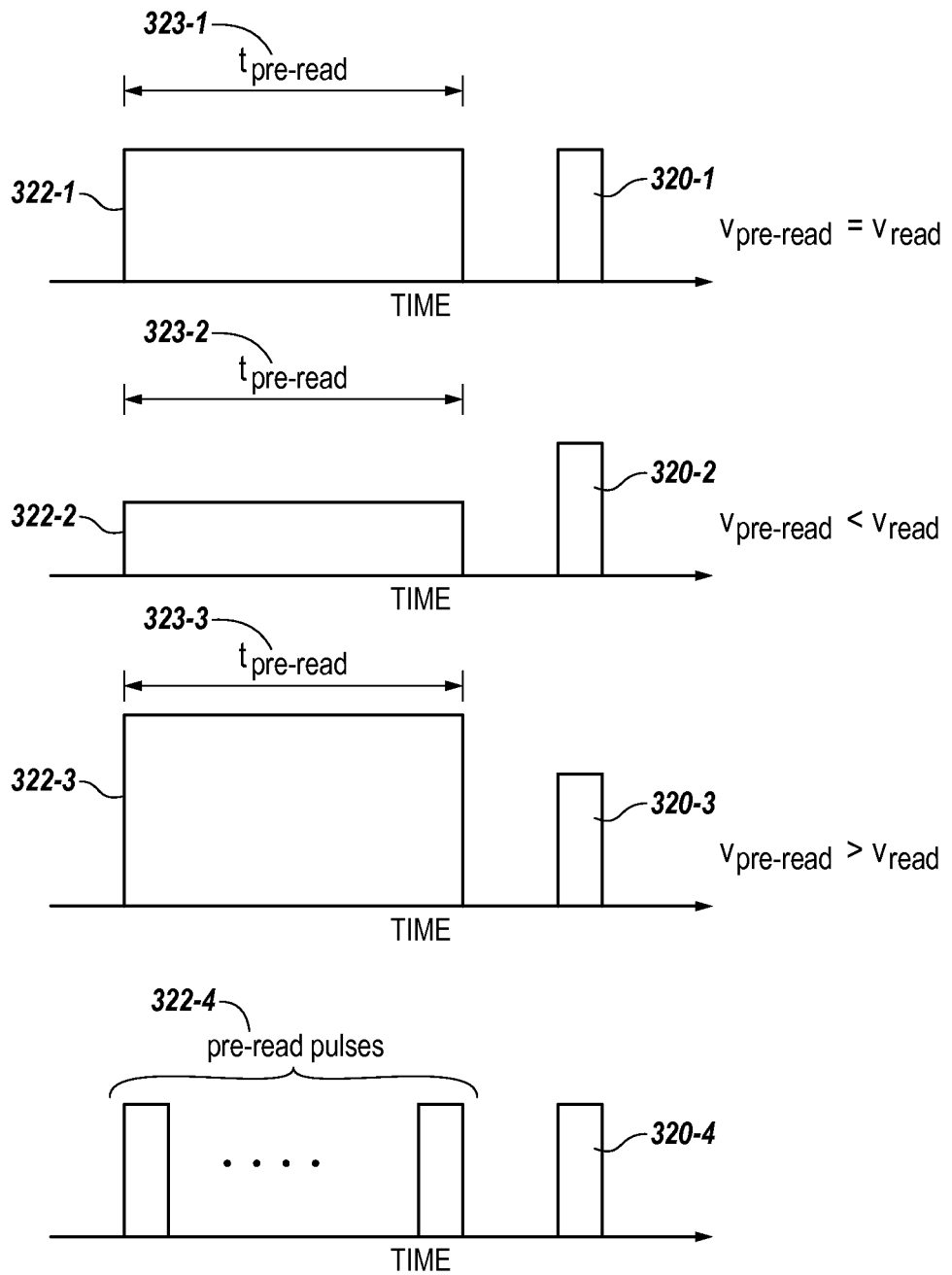
FIG. 3 illustrates example pre-read signals associated with operating resistance variable memory cells in accordance with a number of embodiments of the present disclosure.

As described further in connection with FIG. 3, application of a pre-read signal, e.g., signal 222, can include applying a current and/or voltage to a memory cell for a particular time interval. In a number of embodiments, a pre-read signal 222 can be applied after an application of a programming signal 216 and/or after each of a number of programming operations performed on a selected cell. A subsequent pre-read signal may be applied to the cell only after performing a subsequent programming operation on the cell, in a number of embodiments. The programming signal, e.g., signal 214, can include, for example, a set signal or a reset signal, among others. A pre-read signal can be applied for a particular time interval, and a read signal can be applied following the pre-read signal application. In a number of embodiments, the pre-read signal can be configured to accelerate drift of resistance through the cell and increase stability of a programmed state of the cell.

FIG. 3 illustrates example pre-read signals associated with operating resistance variable memory cells in accordance with a number of embodiments of the present disclosure. A number of different pre-read signals, e.g., 322-1, 322-2, 322-3, and 322-4, can be utilized to accelerate resistance drift. In the example shown in FIG. 3, pre-read signal 322-1 is applied to a selected cell for a time interval 323-1 and has an amplitude equal to that of a read signal 320-1, e.g., $v_{pre\text{-}read} = v_{read}$. In a number of embodiments, applying the pre-read signal for a longer time interval than the read signal may result in accelerated drift and/or increased stability of the programming state, for example. Increasing the pre-read signal time interval, e.g., 323-1, may increase drift acceleration and/or a stability increase regardless of the length of the read signal, in a number of embodiments.

In the example shown in FIG. 3, pre-read signal 322-2 is applied to a selected cell for a time interval 323-2 and has an amplitude less than that of a read signal 320-2, e.g., $v_{pre\text{-}read} < v_{read}$. In this example, pre-read signal 322-3 is applied to a selected cell for a time interval 323-3 and has an amplitude greater than that of a read signal 320-3, e.g., $v_{pre\text{-}read} > v_{read}$. Pre-read signal 322-4 is applied to a selected cell in a number of pre-read pulses, e.g., at least two, at a number of intervals, e.g., time intervals, prior to applying a read signal 320-4. In a number of embodiments, a train of pre-read pulses 322-4 of different amplitudes and time intervals are applied to a selected cell.

Increasing a pre-read signal amplitude can result in increased drift acceleration and/or a stability increase; however, a pre-read amplitude that is above a threshold may result in increased disturbance, e.g., noise, in the memory cell and/or a programming reset. A decreased pre-read amplitude may result in a decreased drift acceleration. Application of a number of pre-read pulses can accelerate resistance drift, and the application can be stopped at a desired point of operation. For example, if it is desired to perform an action on the array, the application of the pre-read pulse can be stopped, the action can be performed, and the application can be restarted.

An amplitude of the pre-read signal applied can affect the rate of acceleration of drift in a number of embodiments. For example, a portion of a pre-read signal having a particular amplitude can be applied to the cell, and a different portion of the pre-read signal having a different amplitude can be applied to the cell. Each portion can be configured to accelerate the drift of the resistance of the cell at a different rate than one another. For example, a higher amplitude pre-read signal may result in an increased drift acceleration as compared to a lower amplitude pre-read signal. A time interval for which the pre-read signal is applied to the cell can be adjusted. Increasing a time interval of a pre-read signal application may result in an increased drift acceleration, for example.

The read signal can be applied to the cell after some period of time following application of the pre-read signal, for example. The read signal application can be shifted in time to allow for actions to be performed on the cell and/or the array, for example. In a number of embodiments, the read signal can be applied contiguous with (e.g., immediately following, without an intervening period of time) the pre-read signal. A number of pre-read signals can be applied before the read signal in a number of embodiments.

In a number of examples, the method including drift acceleration in resistance variable memory can be performed during a wafer testing process. The method including drift acceleration in resistance variable memory can include testing the memory cell, in a number of embodiments. For example, a programming signal can be applied to the memory cell, and a pre-read signal can be applied to the memory cell. The memory cell can be tested, e.g., following the pre-read signal application, and a read signal can be applied to the memory cell.

Figure 4:
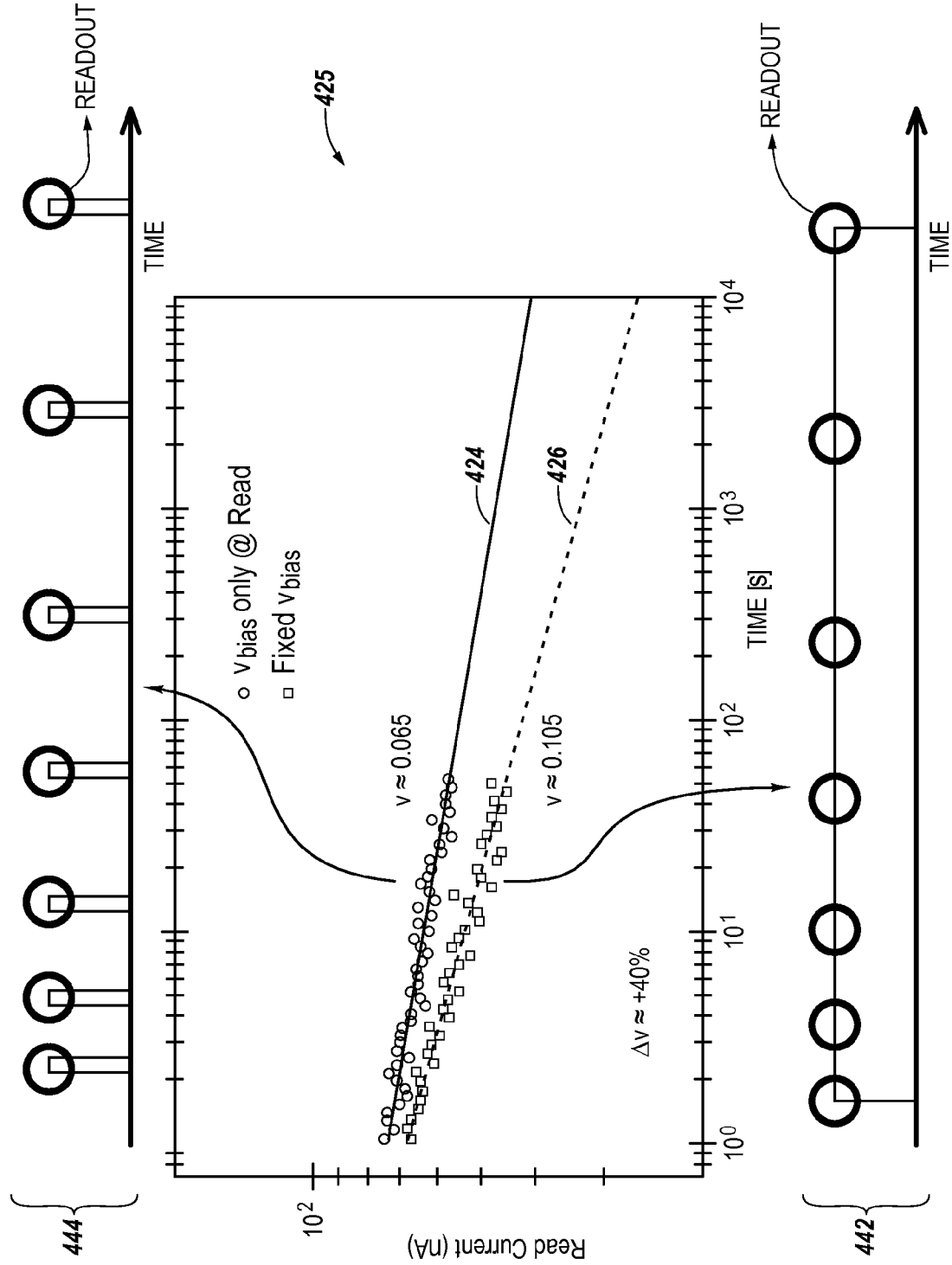
FIG. 4 is a graph illustrating acceleration of resistance drift in accordance with a number of embodiments of the present disclosure.

FIG. 4 is a graph 425 illustrating acceleration of resistance drift in accordance with a number of embodiments of the present disclosure. The graph 425 illustrates read current (nA) versus time (s) for a number of programmed phase change memory cells. As indicated by curves 424 and 426, the read current associated with a programmed memory cell drifts, e.g., decreases, over time. A log-log scale is used for graph 425 to highlight the empirical power law of the read current decrease, e.g., increased resistance, with time:

$$I(t) = I_0\left(\frac{t}{t_0}\right)^{-\nu},$$

where $I_0$ is the resistance at a reference time $t_0$ and $\nu$ is the drift exponent. As an example, $\nu$ can be about 0.1 at room temperature for a cell programmed to a full reset, e.g., fully amorphous, state. The curve 424 represents an average current decrease associated with a number of cells that do not receive a pre-read signal in accordance with embodiments described herein. For instance, curve 424 represents programmed cells receiving an applied bias voltage pulse only when the cell is being read, e.g., only at read time as shown at 444.

The curve 426 represents an average current decrease associated with a number of cells that receive an applied pre-read signal in accordance with embodiments described herein. In this example, curve 426 represents programmed cells receiving a constant applied bias voltage over a particular time interval with the cells being read after application of the pre-read signal, e.g., as shown at 442.

As illustrated in FIG. 4, curve 426 decreases more rapidly than curve 424. That is, the drift exponent (ν) corresponding to curve 426, e.g., 0.105, is larger than the drift exponent corresponding to curve 424, e.g., 0.065. As such, curve 426 represents about a 40% increase in the drift exponent (ν) as compared to curve 424, which corresponds to an accelerated read current drift, e.g., increased resistance drift, associated with curve 426. The increased ν associated with curve 426 can be due to an electric field induced structural relaxation enhancement associated with the constant applied bias voltage applied subsequent to programming the cells and prior to reading the cells. The accelerated drift, e.g., increased ν, associated with curve 426 can be similar to drift acceleration due to an annealing process performed on the cells. Therefore, a number of embodiments of the present disclosure can result in an increased drift acceleration without performing an anneal process to induce structural relaxation, for instance.

Figure 5:
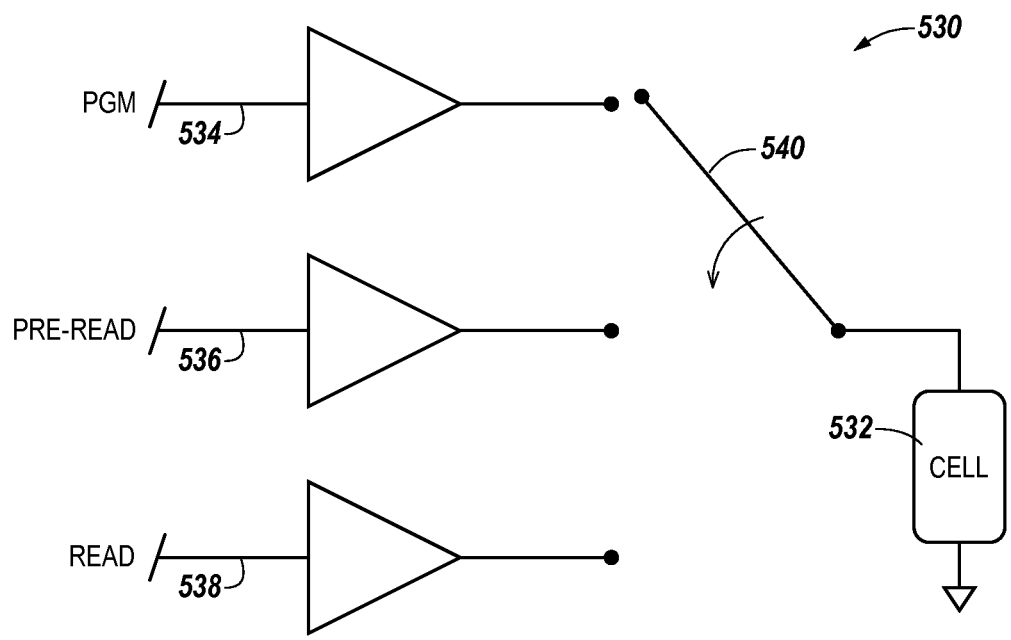
FIG. 5 illustrates a circuit associated with accelerating drift in accordance with a number of embodiments of the present disclosure.

FIG. 5 illustrates a circuit 530 associated with accelerating drift in accordance with a number of embodiments of the present disclosure. Memory cell 532 can be a resistance variable memory cell, e.g., phase change memory cell. The circuit 530 includes a switch 540 operable to selectively couple the memory cell to a program signal 534 (PGM), a pre-read signal 536 (PRE-READ), and a read signal 538 (READ). The pre-read signal 536 can be a pre-read signal such as those described in association with FIGS. 2B and 3, for instance.

Figure 6:
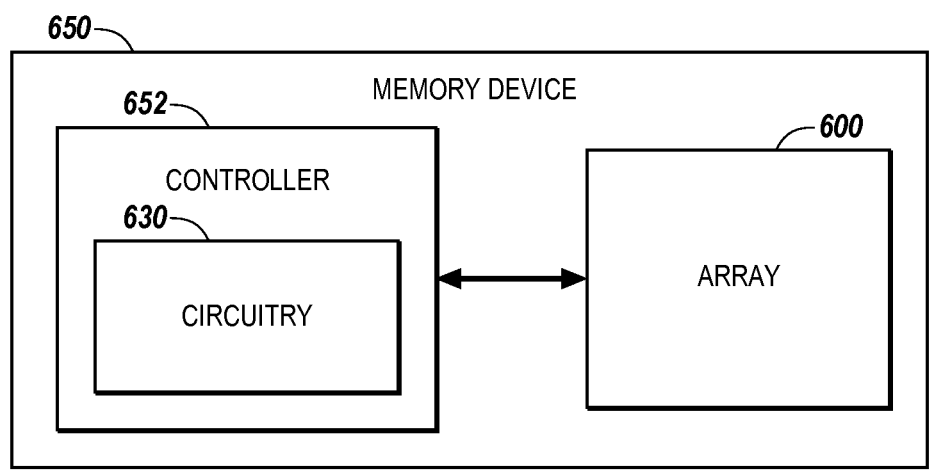
FIG. 6 is an apparatus in the form of a memory device in accordance with a number of embodiments of the present disclosure.

FIG. 6 is an apparatus in the form of a memory device 650 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

As shown in FIG. 6, memory device 650 includes a controller 652 coupled to a memory array 600. Memory array 600 can be, for example, memory array 100 previously described in connection with FIG. 1 Although one memory array is shown in FIG. 6, embodiments of the present disclosure are not so limited (e.g., memory device 650 can include more than one memory array coupled to controller 652).

Controller 652 can include, for example, control circuitry and/or firmware. For instance, controller 652 can include circuitry 630, as illustrated in FIG. 6. Controller 652 can be included on the same physical device (e.g., the same die) as memory array 600, or can be included on a separate physical device that is communicatively coupled to the physical device that includes memory array 600. In a number of embodiments, components of controller 652 can be spread across multiple physical devices (e.g., some components on the same die as the array, and some components on a different die, module, or board).

Circuitry 630 can perform operations in accordance with a number of embodiments of the present disclosure to determine the state of the memory cells in memory array 600. For example, circuitry 630 can be, for example, circuit 530 previously described in connection with FIG. 5.

The embodiment illustrated in FIG. 6 can include additional circuitry that is not illustrated so as not to obscure embodiments of the present disclosure. For example, memory device 630 can include address circuitry to latch address signals provided over I/O connectors through I/O circuitry. Address signals can be received and decoded by a row decoder and a column decoder, to access memory array 600.

CONCLUSION

The present disclosure includes apparatuses and methods including drift acceleration in resistance variable memory. A number of embodiments include applying a programming signal to the resistance variable memory cell to program the cell to a target state, subsequently applying a pre-read signal to the resistance variable memory cell to accelerate a drift of a resistance of the programmed cell, and subsequently applying a read signal to the resistance variable memory cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of operating a resistance variable memory cell, comprising:
    applying a programming signal to the resistance variable memory cell to program the cell to a target state;
    subsequently applying a pre-read signal to the resistance variable memory cell to accelerate a drift of a resistance of the programmed cell; and
    subsequently applying a read signal to the resistance variable memory cell.

2. The method of claim 1, wherein applying the pre-read signal comprises applying a pre-read signal having an amplitude that is equivalent to an amplitude of the read signal.

3. The method of claim 2, including applying the pre-read signal to the cell for a longer time interval than a time interval over which the read signal is applied to the cell.

4. The method of claim 1, wherein applying the pre-read signal comprises applying a pre-read signal having an amplitude that is less than an amplitude of the read signal.

5. The method of claim 1, wherein applying the pre-read signal comprises applying a pre-read signal having an amplitude that is greater than an amplitude of the read signal.

6. The method of claim 1, wherein applying the pre-read signal includes applying at least two pre-read signal pulses.

7. The method of claim 1, wherein the method is performed during a wafer level testing process.

8. The method of claim 1, wherein the read signal is applied after a time interval following application of the pre-read signal.

9. The method of claim 1, wherein the read signal is applied contiguous with the pre-read signal.

10. The method of claim 1, wherein applying the pre-read signal includes:
applying a first portion of the pre-read signal to the cell, the first portion having a first amplitude; and
applying a second portion of the pre-read signal to the cell, the second portion having a second amplitude;
wherein the first portion is configured to accelerate the drift of the resistance at a different rate than a rate at which the second portion is configured to accelerate the drift of the resistance.

11. The method of claim 1, wherein the method includes applying a subsequent pre-read signal to the cell only after performing a subsequent programming operation on the cell.

12. An apparatus, comprising:
an array of resistance variable memory cells; and
a controller coupled to the array and configured to control:
programming a selected memory cell to a target state;
subsequently applying a pre-read signal to the selected memory cell, wherein the pre-read signal is configured to accelerate drift of a resistance of the selected memory cell; and
reading the selected memory cell.

13. The apparatus of claim 12, wherein the selected memory cell is a phase change memory cell, and wherein the pre-read signal is configured to accelerate drift of the resistance by increasing structural relaxation in an amorphous portion of the phase change memory cell.

14. The apparatus of claim 12, wherein the controller is further configured to control applying the pre-read signal to the selected cell after each of a number of programming operations performed on the selected cell.

15. The apparatus of claim 12, wherein the apparatus includes a circuit coupled to the array and configured to:
selectively apply a programming signal to the selected memory cells during programming;
selectively apply the pre-read signal to the selected memory cell; and
selectively apply a read signal to the memory cell during reading.

16. The apparatus of claim 15, wherein the circuit comprises a switch operable to selectively apply the programming signal, the pre-read signal, and the read signal to the selected memory cell.

17. The apparatus of claim 15, wherein the pre-read signal includes a pre-read signal determined based on the target state.

18. A method of operating a phase change memory cell, comprising:
programming the phase change memory cell to a target state;
applying a pre-read signal to the phase change memory cell for a particular time interval; and
reading the phase change memory cell, wherein the pre-read signal is configured to accelerate a drift of a resistance of the programmed memory cell.

19. The method of claim 18, wherein the pre-read signal comprises a plurality of pre-read pulses, and wherein reading the phase change memory cell includes applying a read signal to the phase change memory cell after the plurality of pre-read pulses have been applied to the phase change memory cell.

20. The method of claim 18, wherein accelerating the drift increases a stability of the target state.

21. The method of claim 18, wherein applying the pre-read signal includes applying a number of pre-read pulses at a number of intervals.

22. The method of claim 21, wherein an amplitude of at least one of the pre-read pulses is less than an amplitude of a read signal used for reading the phase change memory cell.

23. The method of claim 21, wherein an amplitude of at least one of the pre-read pulses is greater than an amplitude of a read signal used for reading the phase change memory cell.

24. The method of claim 18, wherein programming the phase change memory cell includes applying a set signal to the phase change memory cell.

25. The method of claim 18, wherein programming the phase change memory cell includes applying a reset signal to the phase change memory cell.

26. The method of claim 18, including adjusting the particular time interval for which the pre-read signal is applied to the phase change memory cell.

27. An apparatus, comprising:
an array of phase change memory cells; and
a controller coupled to the array and configured to control:
programming a phase change memory cell within the array to a target state;
subsequently applying a pre-read signal to the phase change memory cell for a particular time interval, wherein the pre-read signal is configured to accelerate a drift of resistance of the programmed phase change memory cell; and
subsequently reading the phase change memory cell.

* * * * *